United States Patent
Adhikari et al.

(10) Patent No.: US 8,815,658 B2
(45) Date of Patent: Aug. 26, 2014

(54) HETERO-STRUCTURED INVERTED-T FIELD EFFECT TRANSISTOR

(75) Inventors: Hemant Adhikari, Austin, TX (US); Rusty Harris, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/584,673

(22) Filed: Aug. 13, 2012

(65) Prior Publication Data

US 2012/0309141 A1 Dec. 6, 2012

Related U.S. Application Data

(62) Division of application No. 11/948,235, filed on Nov. 30, 2007.

(51) Int. Cl.
*H01L 21/338* (2006.01)
*H01L 21/8234* (2006.01)

(52) U.S. Cl.
USPC ........... 438/157; 257/183; 257/192; 257/200; 257/E21.371; 257/E21.387; 438/176; 438/283; 438/191; 438/689; 438/738

(58) Field of Classification Search
CPC ... H01L 29/7869; H01L 29/785; H01L 29/66; H01L 29/66318; H01L 2924/13066; H01L 2924/13067
USPC ............ 257/12, 183, 192, 196, 200, E21.371, 257/E21.387, 5; 438/47, 94, 172, 157, 176, 438/283, 8, 689, 738, 745, 191
See application file for complete search history.

(56) References Cited

U.S. PATENT DOCUMENTS

| | | | | |
|---|---|---|---|---|
| 4,994,866 A | * | 2/1991 | Awano | 257/190 |
| 5,466,949 A | * | 11/1995 | Okuno | 257/25 |
| 6,362,071 B1 | * | 3/2002 | Nguyen et al. | 438/416 |
| 6,475,890 B1 | | 11/2002 | Yu | |
| 6,600,170 B1 | * | 7/2003 | Xiang | 257/18 |

(Continued)

FOREIGN PATENT DOCUMENTS

WO 2006125040 A3 11/2006

OTHER PUBLICATIONS

H. Rusty Harris et al.,Futtre Fab International, Issue 29; *FinFETs: Challenges in Material and Processing for a New 3D Device Paradigm* Section 5, Wafer Processing 2005.

(Continued)

*Primary Examiner* — Lynne Gurley
*Assistant Examiner* — Galina Yushina

(57) ABSTRACT

The present invention provides a method of forming a transistor. The method includes forming a first layer of a first semiconductor material above an insulation layer. The first semiconductor material is selected to provide high mobility to a first carrier type. The method also includes forming a second layer of a second semiconductor material above the first layer of semiconductor material. The second semiconductor material is selected to provide high mobility to a second carrier type opposite the first carrier type. The method further includes forming a first masking layer adjacent the second layer and etching the second layer through the first masking layer to form at least one feature in the second layer. Each feature in the second layer forms an inverted-T shape with a portion of the second layer.

14 Claims, 6 Drawing Sheets

(56) References Cited

U.S. PATENT DOCUMENTS

| | | | |
|---|---|---|---|
| 6,800,910 B2 | 10/2004 | Lin et al. | |
| 6,855,583 B1* | 2/2005 | Krivokapic et al. | 438/157 |
| 7,045,401 B2* | 5/2006 | Lee et al. | 438/157 |
| 7,265,059 B2 | 9/2007 | Rao et al. | 438/734 |
| 7,902,575 B2 | 3/2011 | Ernst et al. | |
| 2005/0093154 A1 | 5/2005 | Kottantharayil et al. | |
| 2005/0184316 A1 | 8/2005 | Kim et al. | |
| 2006/0076625 A1 | 4/2006 | Lee et al. | |
| 2007/0026615 A1* | 2/2007 | Goktepeli et al. | 438/281 |
| 2007/0052041 A1* | 3/2007 | Sorada et al. | 257/392 |
| 2007/0148837 A1 | 6/2007 | Shah et al. | |
| 2007/0161171 A1 | 7/2007 | Burnett et al. | 438/197 |
| 2007/0170471 A1* | 7/2007 | Joly et al. | 257/278 |
| 2007/0176223 A1* | 8/2007 | Chindalore et al. | 257/314 |
| 2007/0221956 A1 | 9/2007 | Inaba | |
| 2007/0235763 A1 | 10/2007 | Doyle et al. | |
| 2008/0020515 A1* | 1/2008 | White et al. | 438/118 |
| 2008/0073667 A1* | 3/2008 | Lochtefeld | 257/190 |

OTHER PUBLICATIONS

Toshiro Hiramoto et al. 2005 IEEE International SOI Conference, Session No. 6 *Multiple Gate Device* 2005.

* cited by examiner

HETERO-STRUCTURED INVERTED-T FIELD EFFECT TRANSISTOR

CROSS-REFERENCE TO RELATED APPLICATION

This is a divisional of co-pending application U.S. Ser. No. 11/948,235, filed Nov. 30, 2007.

BACKGROUND OF THE INVENTION

1. Field of the Invention

This invention relates generally to semiconductor processing, and, more particularly, to forming a hetero-structured, inverted-T field effect transistor.

2. Description of the Related Art

The constant drive to increase the density of semiconductor devices that can be formed on a wafer and the speed at which these devices operate has led to many modifications in the structure of conventional semiconductor devices. For example, as development goals have approached the 22 nm node, attempts to maintain a conventional planar device scaling have encountered roadblocks including inadequate control of the channel region by the gate electrode, which may lead to short channel effects. Multi-directional control of the channel may allow increased immunity to short channel effects such as sub threshold slopes, drain induced barrier leakage, and the like. Many semiconductor devices may therefore be formed using multigate field effect transistors (FETs). One example of a multi-gate FET incorporates a gate structure formed from an ultrathin body (UTB) that is turned on end relative to conventional planar gate structures (i.e., the UTB gate structure is perpendicular to the substrate). These devices are conventionally referred to as Fin-FETs because of the fin-like shape of the structures that connect the source and drain regions of the Fin-FETs to the gate structure. The Fin-FET devices may offer a means of packing more current (and consequently more speed) into each unit area of a chip while keeping the processing, materials, and circuit design factors relatively consistent with previous technology nodes.

FIGS. 1A, 1B, and 1C conceptually illustrate a conventional method of forming fin structures in a Fin-FET. These figures depict a cross-sectional view 100 of the material layers used to form the fin structures. In the embodiment shown in FIG. 1A, a layer 105 of semiconductor material (e.g., monocrystalline silicon, silicon germanium, or germanium) is formed over a dielectric layer 110 (e.g., silicon dioxide). An oxide layer 115 is then formed over the layer of semiconductor material 105. The oxide layer 115 may serve as a protective layer for the layer 105 for subsequent forming and/or etching of other structures. The oxide layer 115 may also serve as a stress reduction layer for subsequently deposited layers, such as nitride layers. In some embodiments, another nitride layer 120 is deposited. A photoresist layer, which is patterned, using e.g. a mask, is then formed over the nitride layer and is used to transfer the pattern to the nitride layer. The patterned nitride layer 120 is used as a mask to etch the oxide layer 115 and the layer 105 to form the fin structures 125 shown in FIG. 1B. In one embodiment, the patterned nitride layer 120 and the oxide layer 115 may be removed to leave behind the fin structures 125 shown in FIG. 1C.

FIG. 2 conceptually illustrates a top-down view of a conventional transistor 200 formed using Fin-FET techniques. The transistor 200 includes a gate electrode 205 that is positioned between a source 210 and a drain 215. The fin structures 220, such as the thin structures 125 shown in FIGS. 1A-C, have been formed between the source 210 and the drain 215, and these structures extend underneath the gate electrode 205. Examples of Fin-FETs and the techniques that may be used to form. Fin-FETs are found in Rao and Mathew (U.S. Pat. No. 7,265,059), Burnett, et al. (U.S. Patent Application Publication No. 2007/0161171), and Harris, et al. ("Fin-FETs: Challenges in Material and Processing for a New 3-D Device Paradigm," FUTURE FAB International, Issue 23).

The fin structures in conventional Fin-FETs may be configured to provide relatively high drive currents for the CMOS devices that incorporate the Fin-FETs. However, the conventional fin structures have a single orientation and are formed of a single material. Consequently, conventional fin structures can only be optimized to provide high drive currents for a single type of CMOS device, i.e. the fin structures can be optimized for either a PMOS device where high hole mobility is desired or an NMOS device where high electron mobility is desired. Most circuit designs include large numbers of both PMOS and NMOS devices. The process flows used to form the circuit may be optimized for one type of device, but this may also result in a less than optimal process flow for the other type of device.

The subject matter described herein is directed to addressing the effects of one or more of the problems set forth above.

SUMMARY

The following presents a simplified summary of the subject matter described herein in order to provide a basic understanding of some aspects of the present invention. This summary is not an exhaustive overview of the present subject matter described herein. It is not intended to identify key or critical elements of the invention or to delineate the scope of the invention. Its sole purpose is to present some concepts in a simplified form as a prelude to the more detailed description that is discussed later.

In one embodiment, a method is provided for forming a transistor. The method includes forming a first layer of a first semiconductor material above an insulation layer. The first semiconductor material is selected to provide high mobility to a first carrier type. The method also includes forming a second layer of a second, semiconductor material above the first layer of semiconductor material. The second semiconductor material is selected to provide high mobility to a second carrier type opposite the first carrier type. The method further includes forming a first masking layer adjacent the second layer and etching the second layer through the first masking layer to form at least one feature in the second layer. Each feature in the second layer forms an inverted-T shape with a portion of the second layer.

In another embodiment, a transistor is provided. The transistor includes a first layer formed of a first semiconductor material over a buried oxide layer. The first semiconductor material is selected to provide high mobility to a first carrier type. The transistor also includes a second layer formed of a second semiconductor material adjacent the first layer. The second semiconductor material is selected to provide high mobility to a second carrier type opposite the first carrier type. The second layer also includes at least one feature formed in the second layer by etching the second layer through a first masking layer such that each feature in the second layer forms an inverted-T shape with a portion of the first layer.

BRIEF DESCRIPTION OF THE DRAWINGS

The present subject matter may be understood by reference to the following description taken in conjunction with the accompanying drawings, in which like reference numerals identify like elements, and in which.

Figure 1A:
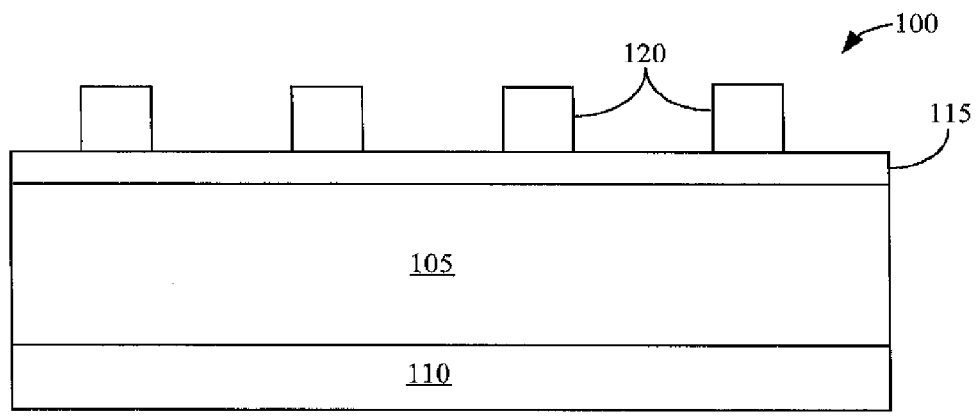
FIGS. 1A, 1B, and 1C conceptually illustrate a conventional method of forming fin structures in a Fin-FET.
Figure 1B:
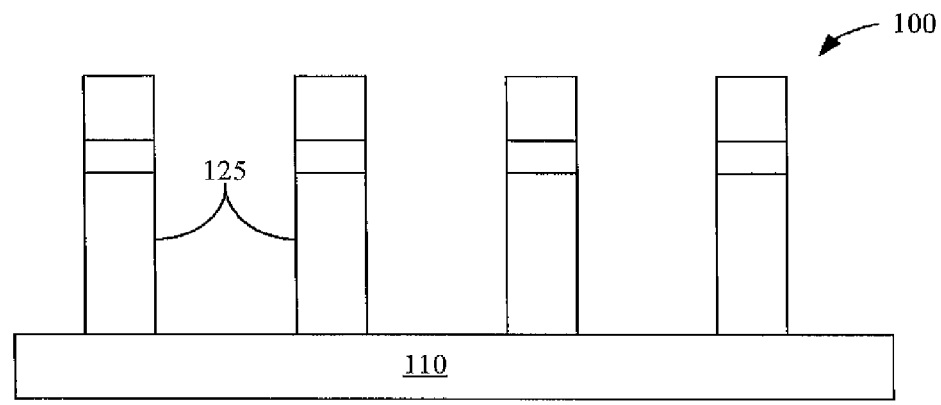

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the scope of the invention as defined by the appended claims.

DETAILED DESCRIPTION OF SPECIFIC EMBODIMENTS

Illustrative embodiments of the present subject matter are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the subject matter described herein, The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 3A, 3B, 3C, 3D, and 3E conceptually illustrate one exemplary embodiment of a method of forming hetero-structured, inverted-T fin structures. These figures depict a cross-sectional view 300 of the material layers used to form the hetero-structured, inverted-T fin structures. In the embodiment shown in FIG. 3A, a first layer 305 of a semiconductor material is formed adjacent a dielectric layer 310. The semiconductor material used to form the layer 305 may be selected to provide relatively high hole or electron mobility. As used herein, the term "adjacent" does not necessarily mean that the first layer 305 and the dielectric layer 310 are in contact, although that may occur in some applications. In some embodiments, one or more layers may be formed between the adjacent first layer 305 and dielectric layer 310. The dielectric layer 310 may be a buried oxide layer formed of silicon dioxide or other insulator and the first layer 305 may be a silicon layer. Alternatively, the layer 305 may be a strained silicon-on-insulator layer 305. Techniques for forming silicon, silicon-on-insulator, and/or strained silicon-on-insulator layers 305 are known to persons of ordinary skill in the art and in the interest of clarity only those aspects of forming these layers 305 that are relevant to the present invention will be discussed herein.

Using the strained, tensile or compressive, silicon-on-insulator layer 305 may allow mobility of electrons and/or holes in the hetero-structured, inverted-T fin structures to be controlled, modified, and/or increased. For example, straining the silicon-on-insulator layer 305 may modify the conduction and/or valence band structure of the strained silicon-on-insulator layer 305 to increase the mobility of electrons and/or holes. Furthermore, the strained silicon lattice in the strained silicon-on-insulator layer 305 may also aid in growing high-quality epitaxial layers (e.g., the germanium layers discussed below) by reducing the possible lattice mismatch defects. Techniques for straining silicon-on-insulator layer 305 to control mobility and/or reduce lattice mismatch defects, as well as to achieve other ends, are known in the art and in the interest of clarity will not be discussed further herein.

Figure 3A:
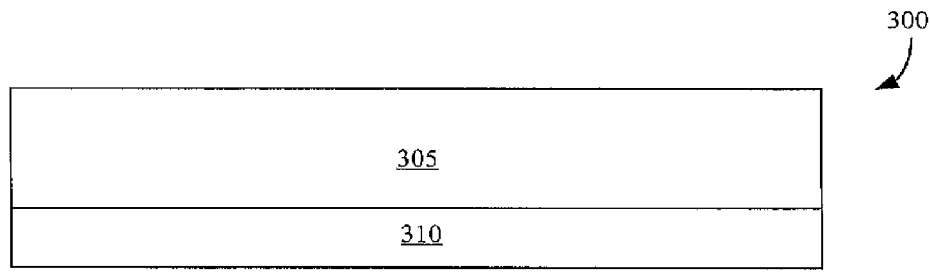
FIGS. 3A, 3B, 3C, 3D, and 3E conceptually illustrate one exemplary embodiment of a method of forming hetero-structured, inverted-T fin structures; as described herein.
Figure 3B:
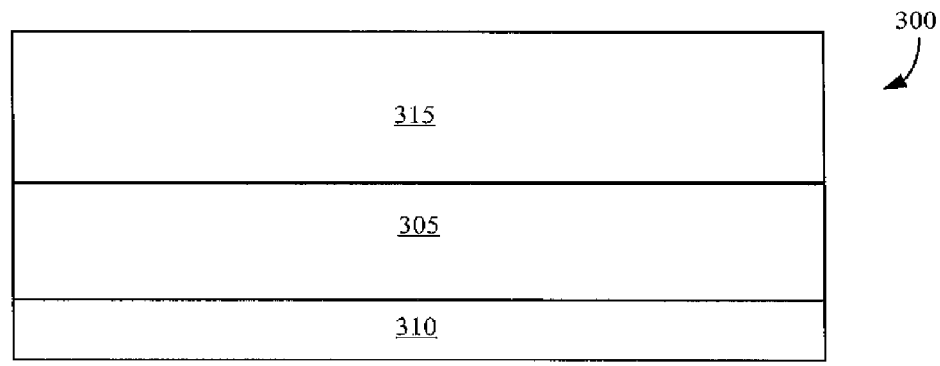

As shown in FIG. 3B, a second layer 315 of a different type of semiconductor material is then formed above the first layer 305 so that the first layer 305 and the second layer 315 are adjacent each other. The semiconductor material used to form the second layer 315 may be selected to provide relatively high hole mobility, if the material used for first layer 305 is selected to provide relatively high electron mobility. For example, if the first layer 305 is formed of silicon-on-insulator then the second layer 315 may be formed of germanium. In one embodiment, the germanium layer 315 may be intrinsically doped and/or may be doped after deposition, e.g., using ion implantation techniques. Techniques for forming germanium layers 315 are known to persons of ordinary skill in the art and in the interest of clarity only those aspects of forming these layers 315 that are relevant to the present invention will be discussed herein. Alternatively, the semiconductor material used to form the second layer 315 may be selected to provide relatively high electron mobility, if the material used for first layer 305 is selected to provide relatively high hole mobility.

Although silicon and germanium are used to form the first and second layers 305, 315 in the illustrated embodiment, persons of ordinary skill in the art having benefit of the present disclosure should appreciate that the present invention is not limited to forming the first and second layers 305, 315 from these materials. In alternative embodiments, other combinations of semiconductor materials may be selected so that one of the layers 305, 315 provides relatively high electron mobility and the other layer 305, 315 provides relatively high hole mobility. Exemplary combinations of materials that may be used to form the first and second layers 305, 315 include using germanium to form the first layer 305 and silicon to form the second layer 315, using GaAs to form the first layer 305 and germanium to form the second layer 315, and using silicon to form the first layer 305 and GaAs to form the second layer 315.

Figure 3C:
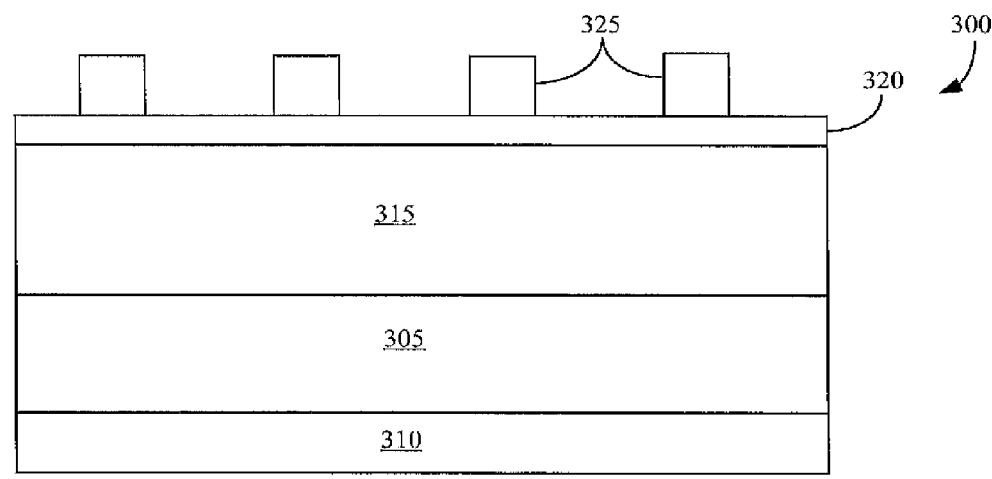

As shown in FIG. 3C, an insulator layer 320, e.g., an oxide, is then formed above the second layer 315. For example, the insulator layer 320 may be formed by depositing an oxide (such as silicon dioxide) over the second layer 315. Alternatively, the insulator layer 320 may be formed by oxidizing an upper portion of the second layer 315. In one embodiment, the insulator layer 320 may serve as a protective layer during subsequent formation and/or etching of other structures. Another layer 325 is then formed over the insulator layer 320, which can be patterned using a photoresist. The patterned masking layer 325 may be formed of a variety of materials, e.g., a nitride layer, and the like. The pattern in the masking layer 325 reflects a desired pattern of structures that are to be formed by etching the second layer 315. For example, the pattern may define the dimensions (e.g., the width and the length) of structures in the plane defined by the interface between the first and second layers 305, 315. The third dimension of the structures (e.g., the height) may be defined by the thickness of the second layer 315.

Figure 3D:
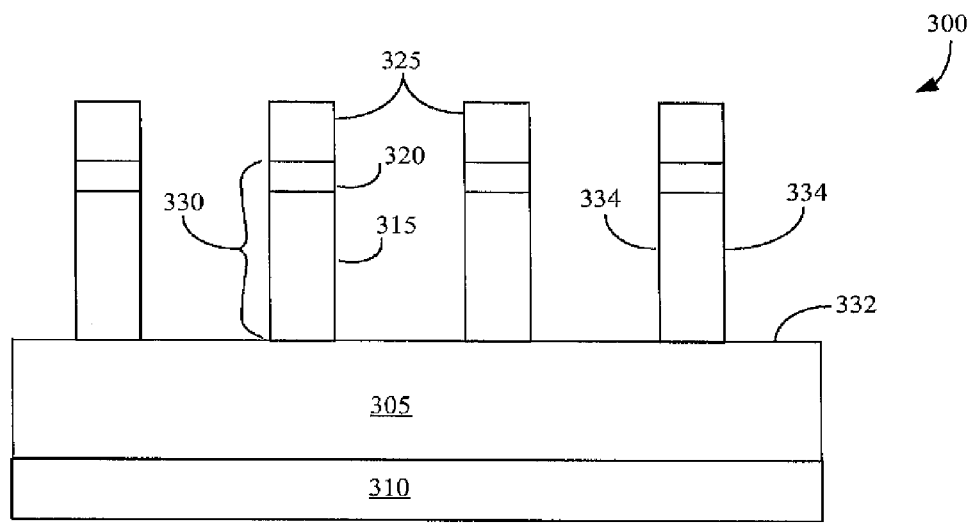
Figure 3E:
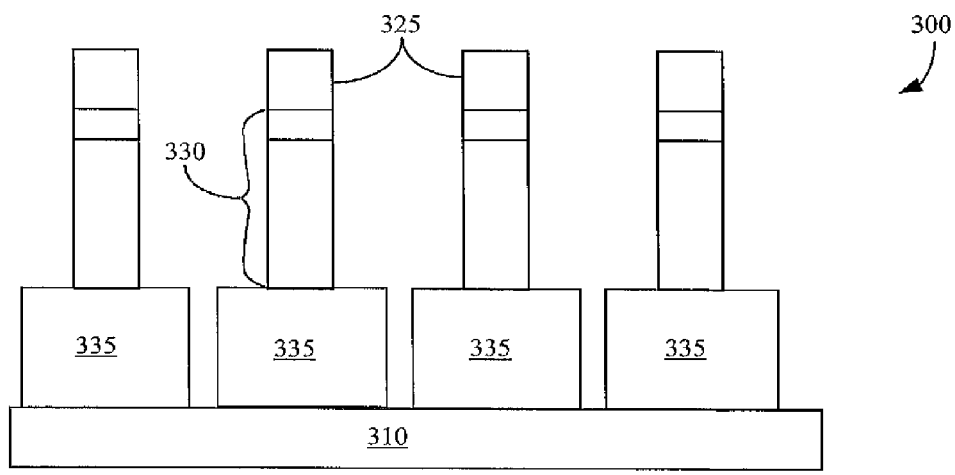

The insulator layer 320 and the second layer 315 may then be etched using the patterned masking layer 325 as a mask, as shown in FIG. 3D. Etching of the second layer 315 may be stopped using etch stop techniques (e.g., such as optical emission spectroscopy) or by timing the duration of the etching process. Etching is preferably stopped before the etching process begins to etch away portions of the first layer 305. However, persons of ordinary skill in the art having benefit of the present disclosure should appreciate that it may be difficult to precisely control the etching so that none of the first layer 305 is etched. Thus, a realistic implementation of the etching process attempts to stop the etching process when substantially all the unmasked portions of the second layer 315 have been etched away (within some tolerance) and substantially none of the first layer 305 has been etched (within some tolerance). The etching process forms fin-shaped structures 330 that include the un-etched portions of the insulator layer 320 and the second layer 315. In one embodiment, the width of the fin-shaped structure 330 (i.e., the dimension in the plane of the paper) is smaller than the depth of the fin-shaped structure 330 (i.e. the dimension that is perpendicular to the plane of the paper). In one embodiment, the thickness of the fin-shaped structure 330 is approximately equal to the thickness of the insulator layer 320 and the second layer 315.

At this point in the processing, the fin-shaped structures 330 and the first layer 305 form a hetero-structured, inverted-T fin structure that may be used for a contiguous device such as a contiguous ultra-thin body (UTB) device. For example, the height of the fin-shaped structures 330 may be substantially in the range of 15-90 nm and the thickness of the first layer 305 may be substantially in the range 1-60 nm. The orientation of the semiconductor materials may be chosen to provide the highest mobility of the associated carrier, e.g. holes or electrons. In one embodiment, the first semiconductor material is chosen to have a (100) orientation and so the conduction planes 332 of the first layer 305 have a planar (100) geometry and the conduction planes of the side wall surfaces 334 of the second layer of the fin-shaped structures 330 have a planar (110) geometry. Alternatively, a different orientation of the first semiconductor material may be chosen, e.g. a (110) orientation, to ensure higher carrier mobility, e.g. a higher hole mobility. In this case the second semiconductor material would be formed with another orientation, e.g. a (100) orientation.

In one alternative embodiment, a multiple gate UTB device may be formed by patterning the first layer 305. In the embodiment shown in FIG. 3E, portions of the first layer 305 are etched away to leave behind base structures 335. Techniques for masking and/or etching portions of the first layer 305 are known in the art and in the interest of clarity will not be discussed further herein. The base structures 335 are formed substantially symmetrically with the fin-shaped structures 330. The width of the base structures 335 is larger than the width of the fin-shaped structures 330. For example, the width of a base structure 335 may be approximately in the range of 60-200 nm and the width of the fin-shaped structures 330 may be approximately in the range 1-60 nm. In some embodiment, the thickness of the base structures 335 may be substantially the same as the thickness of the fin-shaped structures 330. For example, the thickness of the fin-shaped structures 330 and the thickness of the base structures 335 may both be approximately 20 nm. However, this is merely intended as an illustrative example and may not apply in all cases. Consequently, the base structures 335 and the fin-shaped structures 330 form an inverted-T structure that extends (into the plane of the paper). In the illustrated embodiment example depicted herein, the thickness of the base structures 335 is substantially equal to the thickness of the first layer 305.

Figure 4:
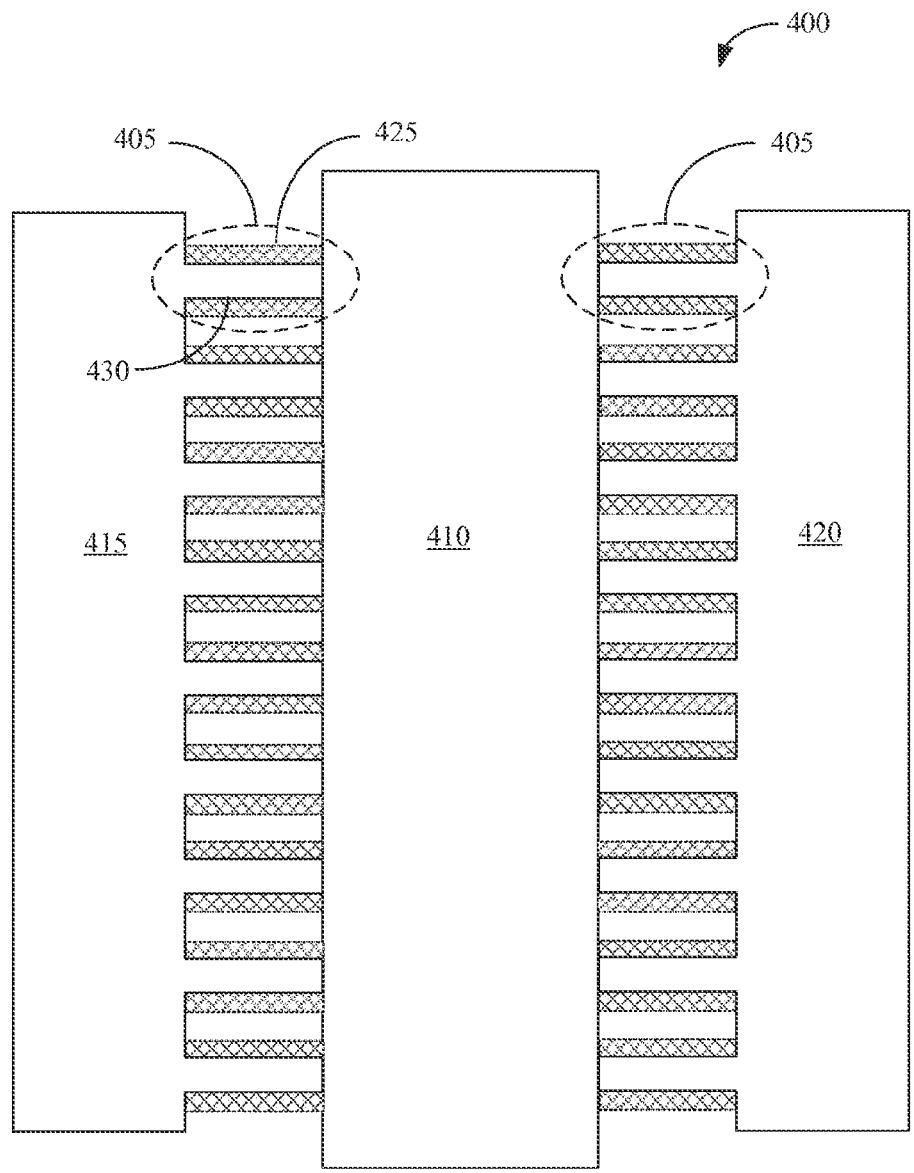
FIG. 4 conceptually illustrates a top-down view of a transistor including hetero-structured, inverted-T fin structures as described herein.

FIG. 4 conceptually illustrates a top-down view of a transistor 400 including hetero-structured, inverted-T fin structures 405. Two of the fin-structures 405 are approximately indicated by dashed ovals in FIG. 4. In the illustrated embodiment, a gate 410, a source region 415, and a drain region 420 have been formed so that the fin-structures 405 will operate as channel regions in the transistor 400. Techniques for forming the gate 410, the source region 415, and the drain region 420, as well as other elements of the transistor 400 such as the gate dielectric, contacts to the gate 410, the source 415, and/or the drain 420, and other backend processes are known in the art. In the interest of clarity, only those aspects of forming the elements of the transistor 400 that are relevant to the present invention will be discussed herein.

Figure 1C:
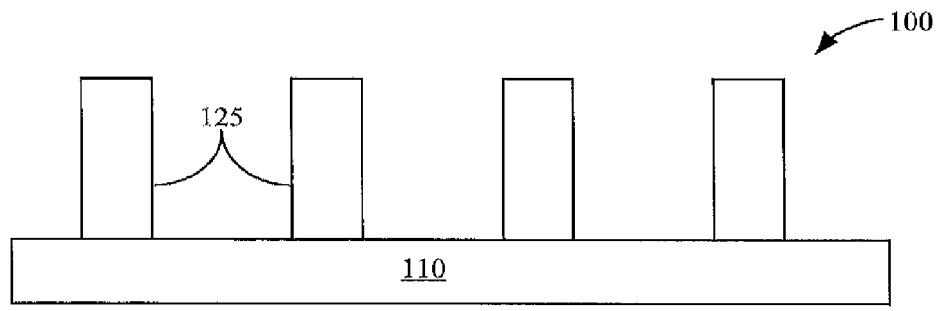
Figure 2:
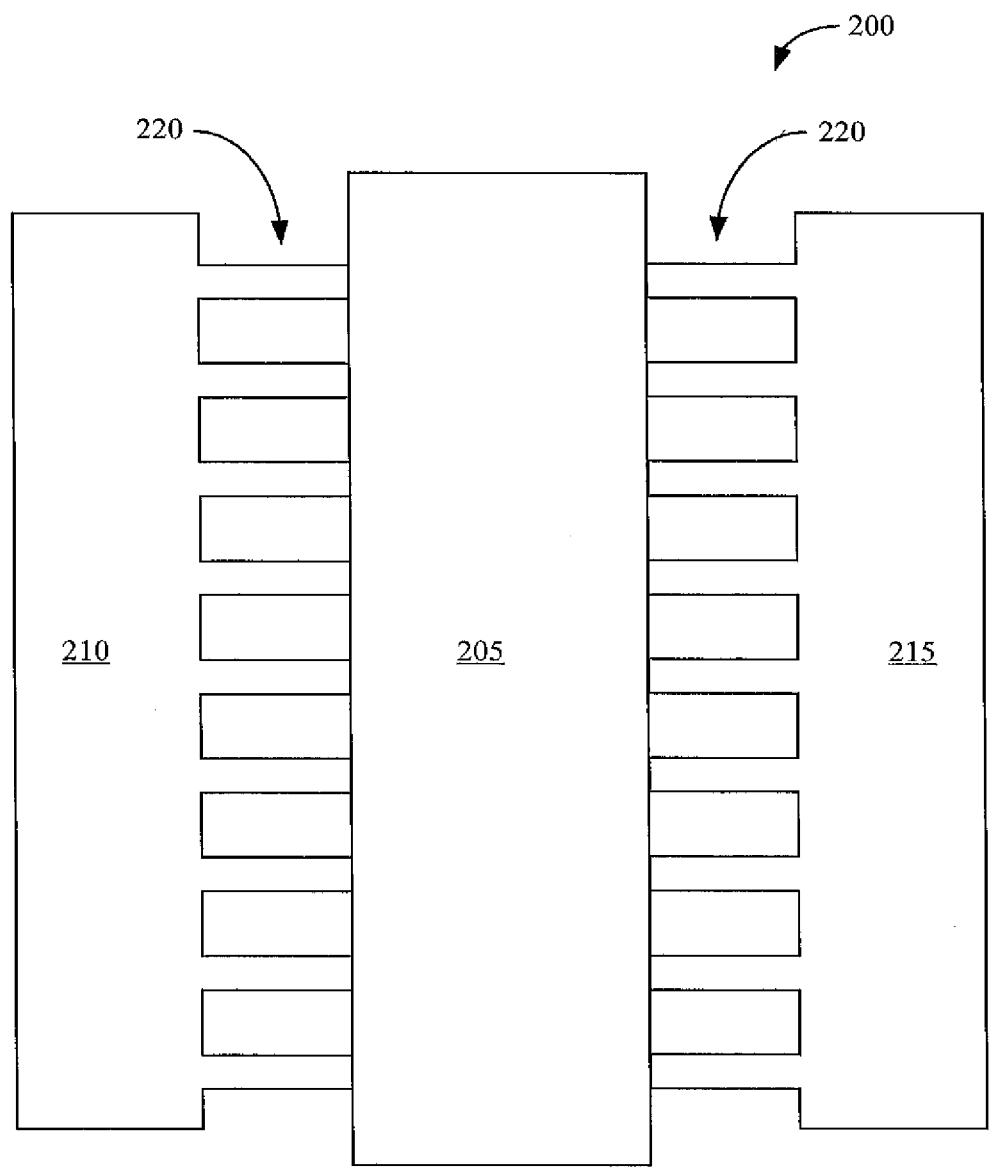
FIG. 2 conceptually illustrates a top-down view of a conventional transistor formed using Fin-FET techniques.

The fin-structures 405 shown in the illustrated embodiment include a base 425 that is formed of silicon and a fin 430 that is formed of germanium. In one embodiment, the fin structures 405 may be formed according to the process shown in FIGS. 3A-3E. The fin shaped structures 405 are controlled by the gate 410 from multiple directions. Consequently, the transistor 400 may be more immune to short channel effects than transistors that use conventional planar transistors. The device geometry of the transistor 400 may be selected to optimize the material and/or orientation dependence of the hole and/or electron mobility to provide higher drive currents than transistors that use a conventional I-shaped (or bar shaped) fin, such as shown in FIG. 1C. For example, when the transistor 400 is implemented as a PMOS device, the germanium portion, example portion 315, of the fin 430 provides relatively high hole mobility. Furthermore, the (110) geometry of the sidewalls (not shown) of the fin 430 have a higher hole mobility than the (100) conduction planes in a planar geometry. The same transistor 400 when implemented as an NMOS device, the (100) conduction plane in the horizontal silicon-based 425 provides higher electron mobility. Symmetric electron mobility in the silicon base 425 and hole mobility in the germanium fin 430 may also allow chip area optimization while still providing symmetric on-state currents in the transistor 400.

The transistor 400 may also be modified in other ways. For example, the channel regions formed by the base 425 and the fin 430 may be intrinsically doped or can be doped, e.g., using ion implantation and annealing techniques. For another example, extensions may be formed using extension implants or by using under lap of dopants from the source region 410 and/or the drain region 415. For yet another example, parasitic resistances may be reduced by a selective epitaxial growth of germanium and/or silicon in regions outside of spacers formed in the transistor 400.

Figure 5A:
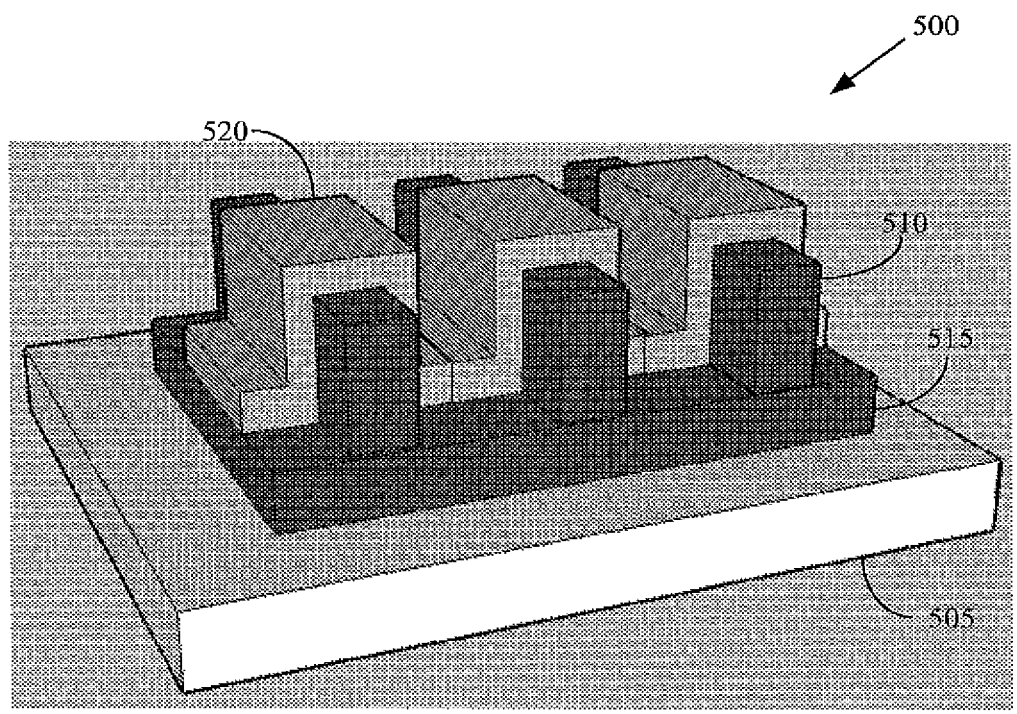
FIG. 5A conceptually illustrates a perspective view of a contiguous ultra-thin body (UTB) device including hetero-structured, inverted-T fin structures; as described herein.

FIG. 5A conceptually illustrates a perspective view of a contiguous ultra-thin body (UTB) device 500. In the illustrated embodiment, the UTB device 500 is formed on a substrate 505 and includes fin-shaped structures 510 and a first layer 515 that form a hetero-structured, inverted-T fin structure. The fin-shaped structures 510 are formed of a first material that is selected to provide a relatively high mobility for a first carrier type, such as holes, and the first layer 515 is formed of a second material that is selected to provide a relatively high mobility for a second carrier type, such as electrons. A layer 520 is then formed over the hetero-structured, inverted-T fin structure. The layer 520 may be used to form gate, source and/or drain structures.

Figure 5B:
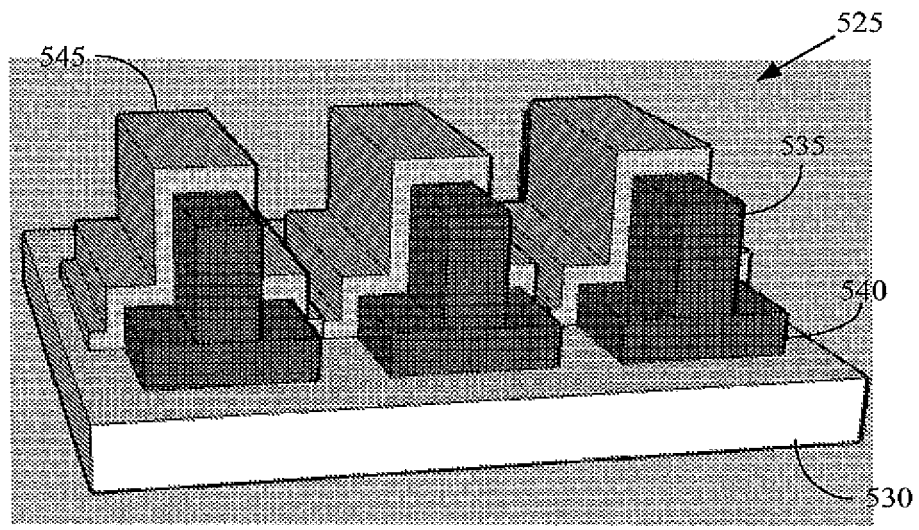
FIG. 5B conceptually illustrates a perspective view of a multiple gate ultra-thin body (UTB) device including hetero-structured, inverted-T fin structures; as described herein.

FIG. 5B conceptually illustrates a perspective view of a multiple gate ultra-thin body (UTB) device 525. In the illustrated embodiment, the UTB device 525 is formed on a substrate 530 and includes fin-shaped structures 535 and base structures 540 that form a hetero-structured, inverted-T fin structure. The fin-shaped structures 535 are formed of a first material that is selected to provide a relatively high mobility for a first carrier type, such as holes, and the base structures 540 are formed of a second material that is selected to provide a relatively high mobility for a second carrier type, such as electrons. A layer 545 is then formed over the hetero-structured, inverted-T fin structure. The layer 545 may be used to form gate, source and/or drain structures.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

What is claimed:

1. A method of forming a transistor, comprising:
    forming a first layer of a first semiconductor material above an insulation layer, wherein the first semiconductor material provides high mobility to a first carrier type;
    forming a second layer of a second semiconductor material adjacent the first layer, wherein the second semiconductor material provides high mobility to a second carrier type opposite the first carrier type;
    etching the second layer to form at least one feature in the second layer such that each feature in the second layer abuts a portion of the first layer and forms an inverted-T shape structure with the portion of the first layer; and
    forming a gate over the inverted-T structure for activating channel regions in said at least one feature in the second layer and the portion of the first layer.

2. The method of claim 1, wherein forming the first layer comprises forming the first layer of a first semiconductor material to provide high electron mobility, and wherein forming the second layer comprises forming the second layer of a second semiconductor material to provide high hole mobility.

3. The method of claim 1, wherein forming the first layer comprises forming the first layer of a first semiconductor material to provide high hole mobility, and wherein forming the second layer comprises forming the second layer of a second semiconductor material to provide high electron mobility.

4. The method of claim 1, wherein forming the first layer comprises forming at least one of a silicon layer, a silicon-on-insulator layer, a strained silicon-on-insulator layer, a germanium layer, and a GaAs layer.

5. The method of claim 1, wherein forming the second layer comprises forming at least one of a silicon layer, a silicon-on-insulator layer, a strained silicon-on-insulator layer, a germanium layer, and a GaAs layer.

6. The method of claim 1, wherein etching the second layer comprises etching the second layer to form said at least one feature having planes of conduction that have a (110) geometry.

7. The method of claim 1, comprising forming a source, a drain, and a gate of the transistor such that the inverted-T structure formed of the first and second layers functions as a channel region between the source and the drain of the transistor when the gate is activated.

8. The method of claim 1, comprising doping at least a portion of at least one of the first and second layers.

9. The method of claim 1, wherein etching the second layer comprises etching the second layer using a pattern representing features having first and second dimensions parallel to a plane of a surface between the second layer and the first layer, the first dimension being smaller than the second dimension.

10. The method of claim 9, wherein etching the second layer comprises etching the second layer using the pattern to form at least one feature having the first and second dimensions and a third dimension perpendicular to the plane of the surface between the first layer and the second layer, the third dimension being larger than the first dimension.

11. The method of claim 1, wherein etching of the second layer is stopped using at least one of an endpoint detection technique or a predetermined etching time so that the etching process does not etch the first layer.

12. The method of claim 11, wherein etching the first layer comprises etching the first layer to form said at least one feature having planes of conduction that have a (100) geometry.

13. The method of claim 11, comprising etching the first layer to form at least one feature abutting at least one feature formed in the second layer such that each feature in the first layer forms an inverted-T shape with a corresponding feature formed in the second layer.

14. The method of claim 13, wherein etching the first layer comprises forming a second pattern and etching the first layer through the second pattern.

* * * * *